(12) United States Patent
Wang

(10) Patent No.: US 6,366,513 B1
(45) Date of Patent: Apr. 2, 2002

(54) REDUCTION OF NOISE IN MEMORY INTEGRATED CIRCUITS WITH DEDICATE POWER SUPPLY BUS AND GROUND BUS FOR SENSE AMPLIFIERS

(75) Inventor: Guowei Wang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/483,381

(22) Filed: Jan. 12, 2000

(51) Int. Cl.[7] ................................................ G11C 7/08
(52) U.S. Cl. ........................ 365/210; 365/208; 365/206; 365/190; 365/189.04; 365/189.07; 365/189.09; 365/226; 365/228; 365/63; 365/51; 365/230.03
(58) Field of Search ................................ 365/206, 208, 365/210, 220, 190, 189.07, 189.09, 226, 228, 63, 51, 189.04, 230.03

(56) References Cited

U.S. PATENT DOCUMENTS

| | | | | |
|---|---|---|---|---|
| 4,535,423 A | * | 8/1985 | Nozaki et al. | 365/51 |
| 5,040,151 A | * | 8/1991 | Miyawaki et al. | 365/226 |
| 5,666,074 A | * | 9/1997 | Chun | 327/51 |
| 5,970,007 A | * | 10/1999 | Shiratake | 365/207 |
| 6,009,031 A | * | 12/1999 | Te | 365/205 |

* cited by examiner

Primary Examiner—Andrew Q. Tran

(57) ABSTRACT

A memory integrated circuit (100) includes a core cell array (102) having a plurality of core cells for storing data in one of a plurality of states, a plurality of power supply buses (140, 142, 144, 146) including a sensing power supply bus (144) and a sensing ground bus (146) dedicated to sensing states of core cells. The integrated circuit firther includes a sense threshold generating circuit (126) which generates a sense threshold signal in response to a power supply potential on the sensing power supply bus and a ground potential of the sensing ground bus. The integrated circuit still further includes a plurality of sense amplifiers (108) which detect the states of core cells in relation to the sense threshold signal. The sense amplifiers are coupled to the sensing power supply bus and the sensing ground bus so that substantially all power supply noise at the plurality of sense amplifiers and the sense threshold generator is common node noise.

14 Claims, 4 Drawing Sheets

$V_{CC1} \approx V_{CC2}$
$V_{SS1} \approx V_{SS2}$

REDUCTION OF NOISE IN MEMORY INTEGRATED CIRCUITS WITH DEDICATE POWER SUPPLY BUS AND GROUND BUS FOR SENSE AMPLIFIERS

BACKGROUND OF THE INVENTION

The present invention relates generally to integrated circuit design. More particularly, the present invention relates to improving performance by reducing noise within an integrated circuit.

Many integrated circuits or portions of integrated circuits are susceptible to noise. Virtually all circuits have a noise margin, which is the amount of noise in the circuit acceptable for the circuit to continue to function properly. Even within the noise margin, dynamic or AC performance can be degraded in the presence of noise.

One example of such a circuit is a memory integrated circuit. A memory stores data in core cells of a core cell array. Each core cell is uniquely addressable by address signals received at address input circuits. Sense amplifiers of the memory circuit detect the state of the data stored in the core cells by comparing a sensed voltage with a reference voltage. The elapsed time between presentation of an address at the address input circuits and the provision by the memory of valid data at data output circuits is the read access time.

In some very large memories, subcircuits can generate noise that affects their own operation and the operation of other circuits. For example, large memories have address input circuits which switch very fast. To speed up operation, and thereby reduce the read access time of the memory, the address input circuits are optimized for speed and switch large amounts of current. These current spikes can be coupled as noise to other subcircuits such as the sense amplifiers. Similarly, some memories that have a large number of outputs or read a large number of data bits simultaneously can switch large amounts of current during a read operation. These current spikes cause noise which can slow or interfere with operation of the sense amplifiers.

Accordingly, there is a need for a memory circuit with reduced noise and improved performance in noisy conditions.

BRIEF SUMMARY OF THE INVENTION

By way of introduction only, an integrated circuit in accordance with the present invention has separate power and ground buses supplying operating power to sensing circuits such as the sense amplifiers of a memory circuit. The power and ground buses are supplied directly from bonding pads independent of the bonding pads used for other power and ground buses of the integrated circuit. Even in an integrated circuit with many circuits switching rapidly, the sensing circuits are isolated from the switching noise.

The foregoing discussion of the preferred embodiments has been provided only by way of introduction. Nothing in this section should be taken as a limitation of the following claims, which define the scope of the invention.

DETAILED DESCRIPTION OF THE PRESENTLY PREFERRED EMBODIMENTS

Figure 1:
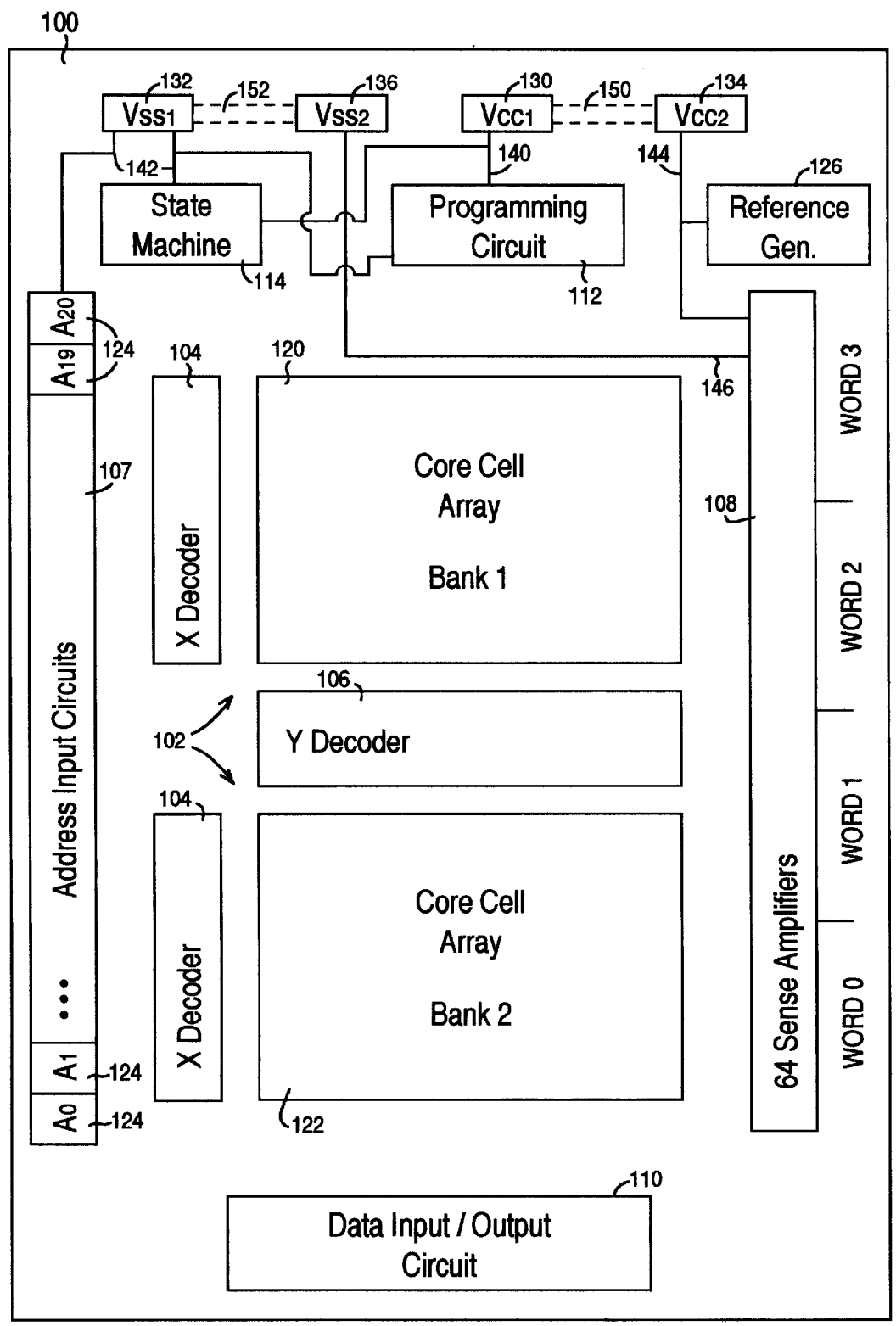
FIG. 1 is a block diagram of an integrated circuit.

Referring now to the drawing, FIG. 1 is block diagram of an integrated circuit 100. In the illustrated embodiment, the integrated circuit 100 is a memory integrated circuit, configured to store data for subsequent retrieval. In the particular embodiment of FIG. 1, the integrated circuit 100 is a flash memory integrated circuit capable of dual mode operation as well as page mode operation. In dual mode operation, the integrated circuit 100 allows a host system to program or erase and immediately and simultaneously read data in the memory, with zero latency. This is desirable because it releases the host system from waiting for the completion of program or erase operations before proceeding with subsequent read operations. In a flash memory, the program or erase time is generally substantially longer than the read time.

In page mode operation, the integrated circuit 100 reads from storage several words of data on a single page. These words may be subsequently output from the integrated circuit in any selected order at reduced access time. In the embodiment of FIG. 1, each page consists of four 16-bit words. When the integrated circuit 100 receives an address, a total of 64 bits of stored data are sensed from the memory. The access time for the first word is the read access time for the memory, or 80 ns in one example. For subsequently reading the other words on the same page, the access time is significantly reduced, to 25 ns for example. In general, the primary design and operational goal for a memory integrated circuit is minimization of the time necessary to perform operations such as reading data from the memory, writing or programming data in the memory and erasing the memory.

The integrated circuit 100 includes a core cell array 102, an X decoder 104, a Y decoder 106, sense amplifiers 108, data input/output circuits 110, a programming circuit 112 and, for control of the integrated circuit 100, a state machine 114. The core cell array 102 comprises a first bank 120 and a second bank 122. Each bank 120, 122 contains an array of core cells, which are the basic units of data storage in the integrated circuit 100. Each core cell stores one or more bits of data. Each core cell may be independently programmed with data which may be subsequently read from the core cell. Thus, each core cell of the core cell array 102 is uniquely addressable.

The X decoder 104 and the Y decoder 106 uniquely select a row and column, respectively, of the core cell array 102 in response to input address signals received at the address input circuits 107. The address input circuits 107 include a plurality of address input buffers 124 which receive address input signals from external to the integrated circuit 100. In the embodiment of FIG. 1, there are 21 address input buffers 124, labeled $A_0$ through $A_{20}$. Thus, the address input circuits 107 are configured to receive address signals associated with core cells of the memory integrated circuit. Since the address signals originate external to the integrated circuit 100, the address signals may switch substantially asynchronously and randomly. In combination with the address input circuits 107, the X decoder 104 and the Y decoder 106 select one row of the core cell array 102 and one or more columns of the core cell array 102 for reading or programming or erasing data in the core cell array 102.

As noted above, the integrated circuit 100 is configured as a dual mode memory integrated circuit capable of simultaneous reading and writing of core cells of the core cell array 102. For this purpose, the core cell array is divided into a first bank 120 and a second bank 122. The control circuitry of the integrated circuit 100 is arranged so that the host system in which the integrated circuit 100 is operated may write or read to the first bank 120 immediately and simultaneously with a write or read to the second bank 122.

To accommodate this operation, the addressing circuitry, including the address input circuits 107, its address input buffers 124, the X decoder 104 and the Y decoder 106 are preferably designed for maximum speed operation with minimum signal delay through the addressing circuitry. The X decoder 104 is coupled to the address input circuits along a series of long, highly capacitive nodes which provide the decoding function. Similarly, the Y decoder 106 is coupled to the address input circuits 107 along a series of highly capacitive nodes. These nodes are not shown in FIG. 1 so as not to unduly complicate the drawing figure. However, in order to rapidly charge and discharge the capacitance associated with the address decoding circuitry, the address input circuits 107, the X decoder 104 and the Y decoder 106 all switch substantially large currents. Such currents may be on the order of several hundred mincroamps in each address input circuit. The total X decoder and Y decoder current may each have peaks of several milliamps.

The sense amplifiers 108 include a plurality of sense amplifiers which detect the states of core cells in relation to a sense threshold signal. Using the Y decoder 106, sensing lines from the core cell array 102 are coupled to the sense amplifiers 108. A reference generating circuit 126 is coupled to the sense amplifiers 108 and configured to provide a reference signal. The sense amplifiers 108 together form a plurality of sensing circuits configured to compare a respective input signal received from the core cell array and a reference signal received from the reference generator 126. The plurality of sensing circuits switch substantially simultaneously in response to sensed data received from the Y decoder 106.

As noted above, the memory integrated circuit 100 is configured as a page mode device. Thus, the memory integrated circuit 100 includes 64 sense amplifiers 108 which detect the states of addressed core cells in relation to a sensed threshold signal received from the reference generator 126. As noted above, operation of the memory circuit 100 to sense the state of addressed core cells is optimized to minimize the time necessary to read the data and present it at the output circuit 110. In order to minimize the portion of the read access time required to reliably sense the state of data in the core cell array, the sense amplifiers 108 are generally relatively high current switching circuits. For example, in one embodiment, at a supply voltage of Vcc=1.8 volts and temperature of 25° C., the sense amplifier switching current is approximately 80 microamps per sense amplifier 108. At this current level, when all sense amplifiers are switching, a total of 5.12 milliamps may be switched. This creates substantial noise on the power and ground buses supplying the sense amplifiers 108. In one example, at this switching current, the voltage bounce on the Vcc bus supplying the sense amplifiers 108 is 41 millivolts peak to peak. At the same switching level, the voltage bounce on the Vss bus is 39 millivolts peak to peak.

In order to isolate noise introduced in the addressing circuitry including the address input circuits 107, the X decoder 104 and the Y decoder 106 from the sensing circuits including the sense amplifiers 108 and the reference generating circuit 126, the sense amplifiers 108 are coupled to a separate power bus from the power bus which supplies the remaining circuitry of the integrated circuit 100. The remaining circuitry, other than the sense amplifiers 108 and reference generating circuit 126, is referred to herein as operating circuitry. The operating circuitry is supplied with the positive operating voltage of the integrated circuit 100, Vcc1, on a first power bus and with the negative operating voltage or ground or Vss1 on a first ground bus. A second power bus Vcc2 and a second ground bus Vss2 are coupled only to the sensing circuits and the reference circuit. In this manner, noise generated by switching of the operating circuitry, particularly the address inputs, is isolated from the sensing circuitry. In this manner, the noise does not affect the operation of the sensing circuitry by slowing down its operation.

As illustrated in FIG. 1, the integrated circuit 100 further includes bonding pads which are configured to receive power supply and ground potentials. The bonding pads include a first bonding pad 130, a second bonding pad 132, a third bonding pad 134 and a fourth bonding pad 136. Further, the integrated circuit 100 includes a first power bus 140 and a first ground bus 142 coupled to operating circuitry of the integrated circuit. The operating circuitry includes all circuitry, such as the address input circuits, the X decoder, the Y decoder and the data input/output circuit, other than the sensing circuitry including the sense amplifiers 108. The integrated circuit 100 further includes a second power bus 144 and a second ground bus 146 coupled only to the plurality of sensing circuits, sense amplifiers 108, and the reference generating circuit 126.

In this manner, by isolating the switching noise introduced by the operating circuitry, in particular the address input circuits, from the sensing circuit including the sense amplifiers 108 and the reference generator 126, the noise margin for the sense amplifiers is improved. The isolation may be enhanced as illustrated in FIG. 1 by separating the bonding pads which arc used to supply operating power to the operating circuitry and the sensing circuitry. Thus, the first bonding pad 130 is coupled to the first power bus 140, which supplies operating power to the operating circuitry. The third bonding pad 134 is coupled with the second power bus 144 which supplies operating power to the sensing circuitry. The second bonding pad 132 is coupled with the first ground bus 142 which supplies operating power to the operating circuitry. The fourth bonding pad is coupled with the second ground bus 146 which supplies operating power to the sensing circuitry.

The noise isolation may be further enhanced by positioning the sensing circuits and the reference circuit on the integrated circuit 100 proximate the third bonding pad and the fourth bonding pad. This reduces the resistive drop experienced in the power bus 144 and the ground bus 146. As is illustrated by the dashed lines in FIG. 1, the two power supply bonding pads 130, 134 may be coupled with a conductive layer 150. The conductive layer 150 can be one of the metal interconnect layers of the integrated circuit 100. Similarly, the two ground supply bonding pads 132, 136 may be coupled by a conductive layer 152. The conductive layers 150, 152 may be omitted to further isolate electrically the sensing circuitry and the operating circuitry.

To reduce the sensitivity of the sense amplifiers 108 to noise introduced by switching of the sensing current in the sense amplifiers 108, the reference generating circuit 126 is preferably placed on the integrated circuit 100 close to the sense amplifiers 108. In FIG. 1, the reference generating circuitry 126 is placed at one end of the sense amplifiers 108, on the same side of the integrated circuit 100.

Figure 2:
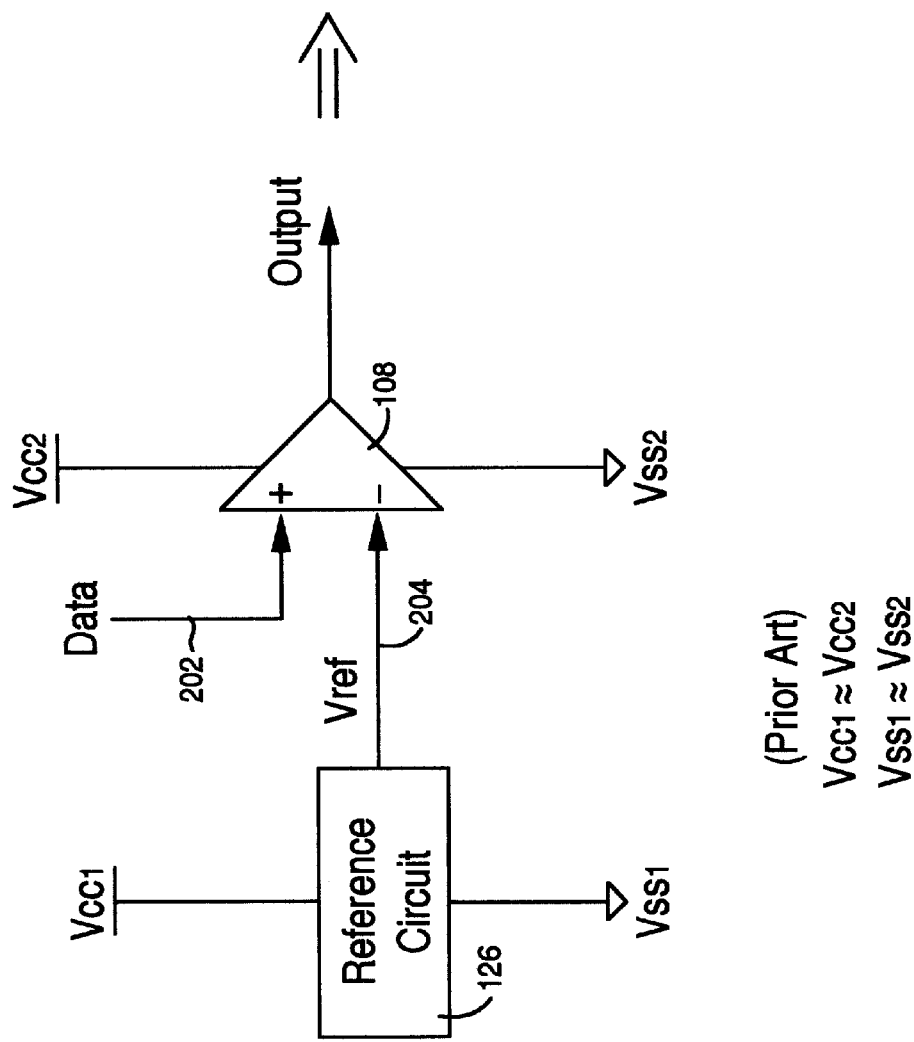
FIG. 2 is a block diagram of a portion of the integrated circuit of FIG. 1.

FIG. 2 illustrates a prior art implementation in which the reference circuit 126 is placed some distance from a sense amplifier 108. The sense amplifier 108 detects a voltage level on a data line 202 coming from the core cell array. The sense amplifier 108 compares the voltage level on the data line 202 with a reference voltage on a reference line 204 coupled to the reference circuit 126. The reference circuit generates the reference voltage Vref. Because, in the prior art implementation of FIG. 2, the reference circuit 126 is located a distance from the sense amplifier 108, the supply voltage and ground potential at each circuit are only approximately equal. The inequality is due to switching noise and resistive voltage drops in the power supply and ground buses supplying the sensing circuit. These resistive drops are enhanced by the switching noise due to large amounts of current being switched by the sense amplifiers, as much as 5 milliamps as noted above. As a result, as illustrated in FIG. 2, the supply voltage for the reference circuit 126, Vcc1, is only approximately equal to the supply voltage for the sense amplifier 108, Vcc2. Similarly, the ground potential for the reference circuit 126, Vss1, is only approximately equal to the ground potential for the sense amplifier 108, Vss2.

The effect of this difference in supply potential and ground potential is to slow down the sensing circuitry. The noise level on the voltage supply as the sense amplifiers switch may result in a variation in sensing threshold of the individual sense amplifiers. Each sense amplifier 108 compares the voltage level on the data line 202 with the voltage Vref on the reference line 204. The voltage Vref is generated in relation to either Vcc1 or Vss1 supplied to the reference generating circuit 126. If, because of noise on the power or ground bus, the reference voltage on the reference line 204 varies, additional time may be required to accurately sense the state of the data stored in the presently read core cell, detected on the data line 202. By a similar process, noise on the power and ground buses supplying the sense amplifier 108 may slow the sensing operation of this circuit. Under worst case conditions, a wrong sensing result may be produced, if the noise on Vcc1, Vcc2 and Vss1, Vss2 are substantial.

Figure 3:
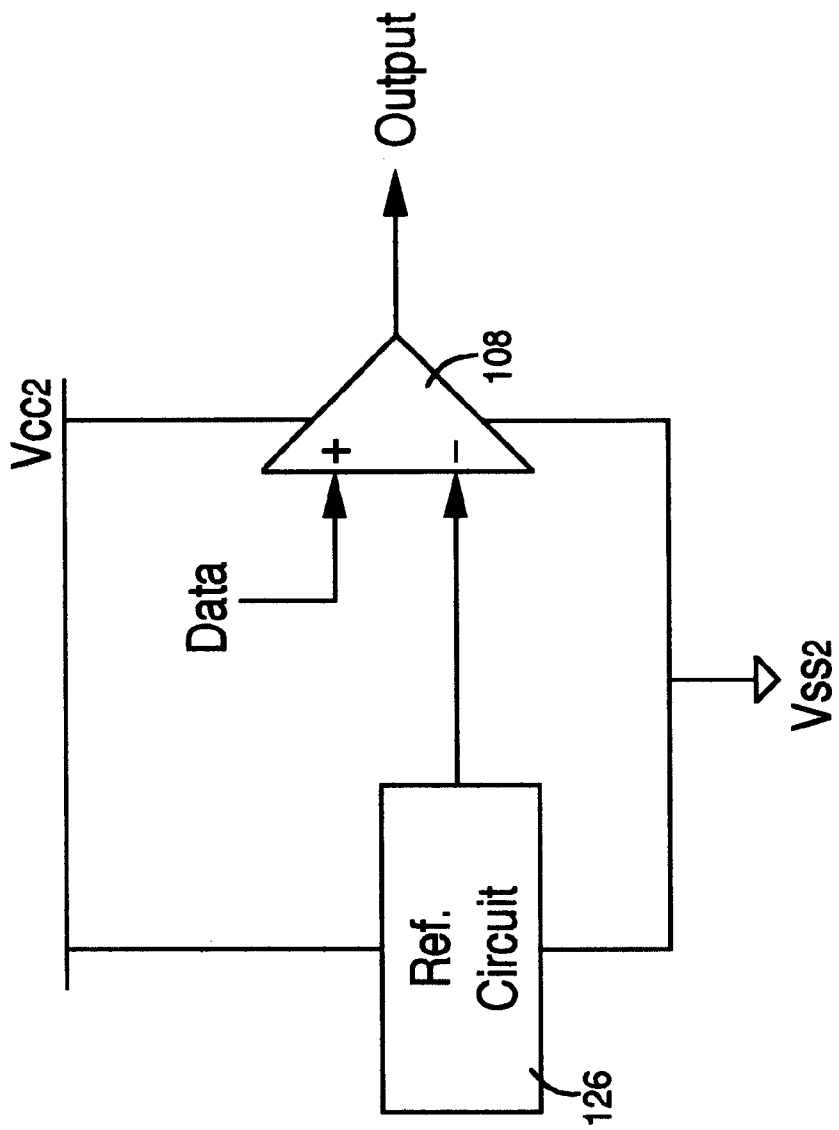
FIG. 3 is a block diagram of a portion of the integrated circuit of FIG. 1.

The solution to the problem illustrated in FIG. 2 is illustrated in FIG. 3. Here, the reference voltage generating circuit 126 is located close to the sense amplifier 108 so that the voltage supply Vcc2 and ground potential Vss2 are substantially equal. As a result, any noise introduced in the power supply bus Vcc2 or the ground bus Vss2 will affect both the sense amplifier 108 and the reference circuit 126. Preferably, the power supply bus Vcc2 has a length to minimize variation in the power supply potential between the sensing circuits, the sense amplifier 108 and the reference generating circuit 126. Similarly, the ground bus Vss2 which couples the sensing circuits, sense amplifier 108, and the reference generating circuit 126 has a length to minimize variation in ground potential between the sensing circuits and the reference generating circuit. This length is preferably obtained by positioning the reference generating circuit 126 proximate the sensing circuits. Ideally, the reference generating circuit 126 is placed immediately next to the sense amplifiers 108 on the integrated circuit 100 to minimize variation in the power supply potential at the reference generating circuit 126 and the sense amplifier 108. In this way, the noise becomes common node noise and does not have any net distortion on the sensing result.

Figure 4:
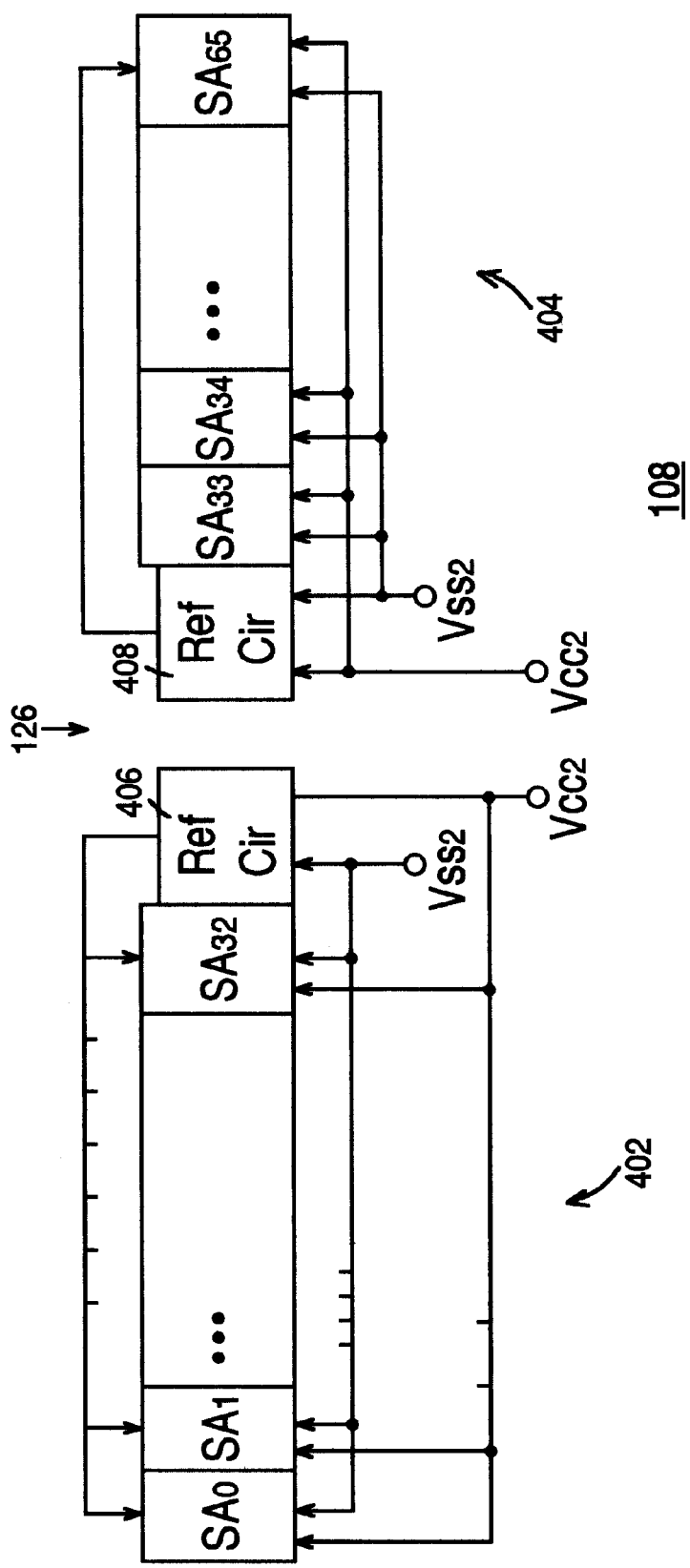
FIG. 4 is an alternative embodiment of the sensing circuitry of FIG. 1.

FIG. 4 illustrates an alternative embodiment of the sensing circuitry of FIG. 1. In FIG. 4, the sense amplifiers have been separated into a first group of sensing circuits 402 and a second group of sensing circuits 404. The first group of sensing circuits includes a total of 33 sense amplifiers labeled $SA_0$ through $SA_{32}$. The second group 404 of sensing circuits includes sense amplifiers labeled $SA_{33}$ through $SA_{65}$. Thus, the sensing circuit includes a total of 66 sense amplifiers. Sixty-four of the sense amplifiers are active at one time. Two additional sense amplifiers are redundant and provided to be switched in in the event of failure of one of the regular sense amplifiers.

The reference generating circuit 126 in the embodiment of FIG. 4 includes a first reference generating circuit 406 generating the sensing reference voltage for the first group 402 of sensing circuits and a second reference generating circuit 408 generating the sensing reference voltage for the second group 404 of sensing circuits. As can be seen in the diagram of FIG. 4, the first reference generating circuit 406 is positioned proximate the first group 402 of the sensing circuits. The second reference generating circuit 408 is positioned proximate the second group 404 of sensing circuits. The first reference generating circuit 406 shares a common power supply bus Vcc2 and a common ground bus Vss2 with the first group 402 of sensing circuits. Similarly, the second reference generating circuit 408 shares a common power supply bus Vcc2 and a common ground bus Vss2 with the second group 404 of sensing circuits.

In this manner, resistive voltage variation and noise on the power supply bus Vcc2 and the ground bus Vss2 are minimized. This iminimization occurs because, first, the reference generating circuits 406, 408 are placed very close to each of the sense amplifiers served by the respective reference generating circuits 406, 408. Since the resistive drop in a power supply bus or a ground bus is proportional to the length of the bus, by reducing the length of the bus, the resistive drop is reduced. Here, the total length of the power supply bus and the ground bus are reduced by approximately one-half in relation to the embodiment of FIG. 1, where the reference generating circuit 126 was located at one end of the sense amplifiers 108. Second, the sensitivity to noise in the sensing circuitry embodied in FIG. 4 is reduced because the switching noise associated with sense amplifiers $SA_0$ through $SA_{32}$ is isolated from the switching noise associated with sense amplifiers $SA_{33}$ through $SA_{65}$. In general, when the memory integrated circuit 100 is active, as address signals are applied to the address input circuits 107, the decoding circuitry and the sensing circuitry and the sensing circuitry operates to select one or more memory cells of the core cell array 102 and sense the state of the data stored in those memory cells. With each variation of the address input signal, some or all of the sense amplifiers 108 become active and switch state. In the embodiment of FIG. 4, noise from half of the sense amplifiers 108 is isolated from noise generated by the other half of the sense amplifiers 108. Further, noise generated by each group 402, 404 of sensing circuits is isolated from the reference generating circuits 406, 408. The net effect is to improve the noise margin of each of the sense amplifiers, thereby improving reliability and speed of performance of the sense amplifiers 108. While the sense amplifiers 108 have been divided into two groups in the embodiment of FIG. 4, it is to be understood that any suitable partition will provide similar benefits.

From the foregoing, it can be seen that the present invention provides improved noise performance in an integrated circuit such as a memory circuit. The power and ground buses supplying noise generating circuits such as address inputs are separated from the power and ground buses supplying noise-sensitive circuits such as sense amplifiers. The reference generating circuits which generate the sensing threshold signal for the sense amplifiers share a power supply bus and a ground bus with the sense amplifiers. Further, the reference generating circuits are placed physically close to the sensing circuits so that any noise introduced in the power and ground buses of these circuits is common node noise which does not affect the net noise immunity of the sensing circuits.

While one embodiment of the invention has been shown and described, variations are possible. For example, while the invention has been described in relation to a dual bank, page mode memory integrated circuit, the inventive concepts and details may be applied to other types of integrated circuits as well. It is therefore intended in the appended claims to cover all such modifications falling within the true spirit and scope of the claims.

What is claimed is:

1. An integrated circuit comprising:

operating circuitry;

a plurality of sensing circuits coupled to the operating circuitry for comparing a respective input signal and a reference signal, the plurality of sensing circuits switching substantially simultaneously;

a reference circuit coupled with the plurality of sensing circuits for providing the reference signal;

a first power bus and a first ground bus coupled to the operating circuitry; and a second power bus and a second ground bus coupled only to the plurality of sensing circuits and the reference circuit.

2. The integrated circuit of claim 1 wherein the operating circuitry comprises a plurality of input circuits for receiving a plurality of input signals, including the respective input signal, which are susceptible to changing rapidly and substantially simultaneously.

3. The integrated circuit of claim 2 wherein the plurality of input circuits are coupled with the first power bus and the first ground bus.

4. The integrated circuit of claim 1 further comprising a first bonding pad coupled with a first power bus, a second bonding pad coupled with the first ground bus, a third bonding pad coupled with the second power bus and a fourth bonding pad coupled with the second ground bus.

5. The integrated circuit of claim 4 wherein the plurality of sensing circuits and the reference circuit are positioned on the integrated circuit proximate the third bonding pad and the fourth bonding pad.

6. The integrated circuit of claim 1 further comprising a first bonding pad coupled with the first power bus and the second power bus and a second bonding pad coupled with the first ground bus and the second ground bus.

7. A memory integrated circuit comprising:

a plurality of core cells for storing data in one of a plurality of states;

a plurality of power supply buses and ground buses including a sensing power supply bus and a sensing ground bus coupled to the plurality of core cells dedicated to sensing states of the plurality of core cells;

a sense threshold generating circuit coupled to the sensing power supply bus and the sensing ground bus for generating a sense threshold signal in response to a power supply potential on the sensing power supply bus and a ground potential of the sensing ground bus; and a plurality of sense amplifiers which detect the states of core cells in relation to the sense threshold signal, the plurality of sense amplifiers being coupled to the sensing power supply bus and the sensing ground bus so that substantially all power supply noise at the plurality of sense amplifiers and the sense threshold generator is common node noise.

8. The memory integrated circuit of claim 7 further comprising:

a plurality of data output circuits coupled to the plurality of sense amplifiers, wherein the plurality of sense amplifiers detect four words simultaneously and the data output circuits select one word of the four words.

9. The memory integrated circuit of claim 7 further comprising:

a plurality of address input circuits for receiving address signals associated with core cells of the memory integrated circuit, the address signals switching substantially asynchronously and introducing power supply noise in the memory integrated circuit.

10. The memory integrated circuit of claim 9 wherein the address input circuits are coupled to another power supply bus and another ground bus different from the sensing power supply bus and the sensing ground bus to isolate the power supply noise from the plurality of sense amplifiers and the sense threshold generator.

11. A memory integrated circuit comprising:

a plurality of address input circuits for receiving respective address signals;

a core cell array including a first bank and a second bank, the memory integrated circuit capable of performing a write operation to an address in one bank and an immediate and simultaneous read operation to an address in the other bank;

sensing circuitry including:

a plurality of sense amplifiers for sensing states of addressed core cells in relation to a sense threshold signal, and a plurality of power supply buses and ground buses, including a sensing power supply bus and a sensing ground bus coupled to the sensing circuitry and dedicated to providing operating power to the sensing circuitry to isolate switching noise from the plurality of address input circuits from the sensing circuitry.

12. The memory integrated circuit of claim 11 wherein the plurality of power supply buses and ground buses further comprises a second power supply bus and a second ground bus for supplying operating power to the plurality of address input circuits.

13. The memory integrated circuit of claim 11 further comprising an X decoder circuit and a Y decoder circuit coupled between the plurality of address input circuits and the core cell array for selecting a core cell address in response to the respective address signals, the sensing circuitry sensing status of addressed core cells at the core cell address.

14. The memory integrated circuit of claim 13 wherein the respective address signals may switch asynchronously and simultaneously to produce the switching noise.

* * * * *